US009846184B2

(12) United States Patent
Dobyns et al.

(10) Patent No.: US 9,846,184 B2
(45) Date of Patent: Dec. 19, 2017

(54) COMBINATORIAL MASK TRIGGERING IN TIME OR FREQUENCY DOMAIN

(71) Applicant: Tektronix, Inc., Beaverton, OR (US)

(72) Inventors: Kenneth P. Dobyns, Beaverton, OR (US); Gary J. Waldo, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 1169 days.

(21) Appl. No.: 13/682,645

(22) Filed: Nov. 20, 2012

(65) Prior Publication Data

US 2014/0142880 A1 May 22, 2014

(51) Int. Cl.
*G01R 23/165* (2006.01)
*G01R 13/02* (2006.01)
*G01R 23/16* (2006.01)

(52) U.S. Cl.
CPC ....... *G01R 23/165* (2013.01); *G01R 13/0254* (2013.01); *G01R 23/16* (2013.01)

(58) Field of Classification Search
CPC .. G01R 23/165; G01R 13/0254; G01R 23/16; G01R 23/00; G01H 3/08
See application file for complete search history.

(56) References Cited

U.S. PATENT DOCUMENTS

| 7,873,486 B2* | 1/2011 | Earls | G01R 13/0254 324/76.19 |
| 2010/0204938 A1* | 8/2010 | Hillman, Jr. | G01R 13/0254 702/76 |
| 2010/0204939 A1 | 8/2010 | Hillman et al. | |
| 2011/0274150 A1 | 11/2011 | Dement | |

OTHER PUBLICATIONS

U.S. Appl. No. 13/480,294, filed May 24, 2012 Title: Time-Domain Density Triggering in a Test and Measurement Instrument.
European Patent Office, Extended European Search Report and Opinion for European Patent Application No. 3193145.3, Mar. 7, 2017, 10 pages, EPO, Munich, Germany.

* cited by examiner

*Primary Examiner* — Mohamed Charioui
*Assistant Examiner* — Jeremy Delozier
(74) *Attorney, Agent, or Firm* — Marger Johnson; Kevin Dothager

(57) ABSTRACT

Embodiments of the invention include methods and instruments for performing combinatorial mask triggering. One or more mask triggers can be configured. Combinatorial mask triggering logic can make various determinations about the relationship between a digitized signal and the one or more mask triggers. The various determinations about the relationship can include considerations of both space and time. When the combinatorial trigger criteria have been satisfied, a trigger signal is generated, and the digital data associated with an incoming signal is stored to memory. The combinatorial mask triggering logic can operate on signals in the frequency domain, the time domain, or both.

19 Claims, 13 Drawing Sheets

COMBINATORIAL MASK TRIGGERING IN TIME OR FREQUENCY DOMAIN

BACKGROUND

Embodiments of the present invention relate to mask triggering, and more particularly, to combinatorial mask triggering in the time or frequency domain on a test and measurement instrument.

Modern test and measurement instruments, such as high-speed digital oscilloscopes, include acquisition systems that capture measurement data pertaining to incoming electrical signals under test. Different kinds of criteria can be used to trigger an acquisition of data on the test and measurement instrument. For example, triggering can be based on a "mask region" defined within the drawing plane of a display device. Trigger logic can detect excursions of trace components represented by pixels drawn on the display within the mask region, and in response, cause a mask failure and/or trigger event to occur.

In a conventional frequency mask triggering system, a spectrum acquisition process is "free-running," or in other words, as soon as the system is ready, acquisition data is acquired and processed to generate a spectrum. This spectrum is then rasterized into an image plane. As the individual spectrum traces or frequency components are rasterized, they are tested against the frequency mask. If the trace fails the mask criteria (e.g., an excursion through the mask region occurs), a trigger is generated, and digital data is acquired and stored in a memory.

In a conventional time domain triggering system, triggering can occur based on a variety of criteria. For example, acquired data can be tested against one or more "visual trigger zones" and if zone criteria are met, then the acquired waveform is processed further. If the zone criteria are not met, the waveform is discarded.

What is missing in conventional approaches is the element of time relative to special considerations. More specifically, while signals and relationships between components of signals can be expressed in terms of space and/or time, the conventional triggering methods lack the ability to build associations and trigger criteria around spatial aspects in combination with time-related aspects of the signal under test.

Moreover, while multiple mask regions or visual trigger zones are known, there remains a need for multiple region mask triggering and/or density triggering in both time and frequency domain acquisitions. Accordingly, a need remains for combinatorial mask triggering involving multiple trigger mask regions, along with trigger criteria involving logical, spatial and/or timing relationships between the mask regions, so that more sophisticated triggering modes can be supported. Embodiments of the invention address these and other limitations in the prior art.

The foregoing and other features and advantages of the inventive concepts will become more readily apparent from the following detailed description of the example embodiments, which proceeds with reference to the accompanying drawings.

DETAILED DESCRIPTION

Reference will now be made in detail to embodiments of the present invention, examples of which are illustrated in the accompanying drawings. In the following detailed description, numerous specific details are set forth to enable a thorough understanding of the inventive concepts. It should be understood, however, that persons having ordinary skill in the art may practice the inventive concepts without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first trigger mask could be termed a second trigger mask, and, similarly, a second trigger mask could be termed a first trigger mask, without departing from the scope of the inventive concept.

The terminology used in the description of the various embodiments herein is for the purpose of describing particular embodiments only and is not intended to be limiting of the inventive concepts. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1:
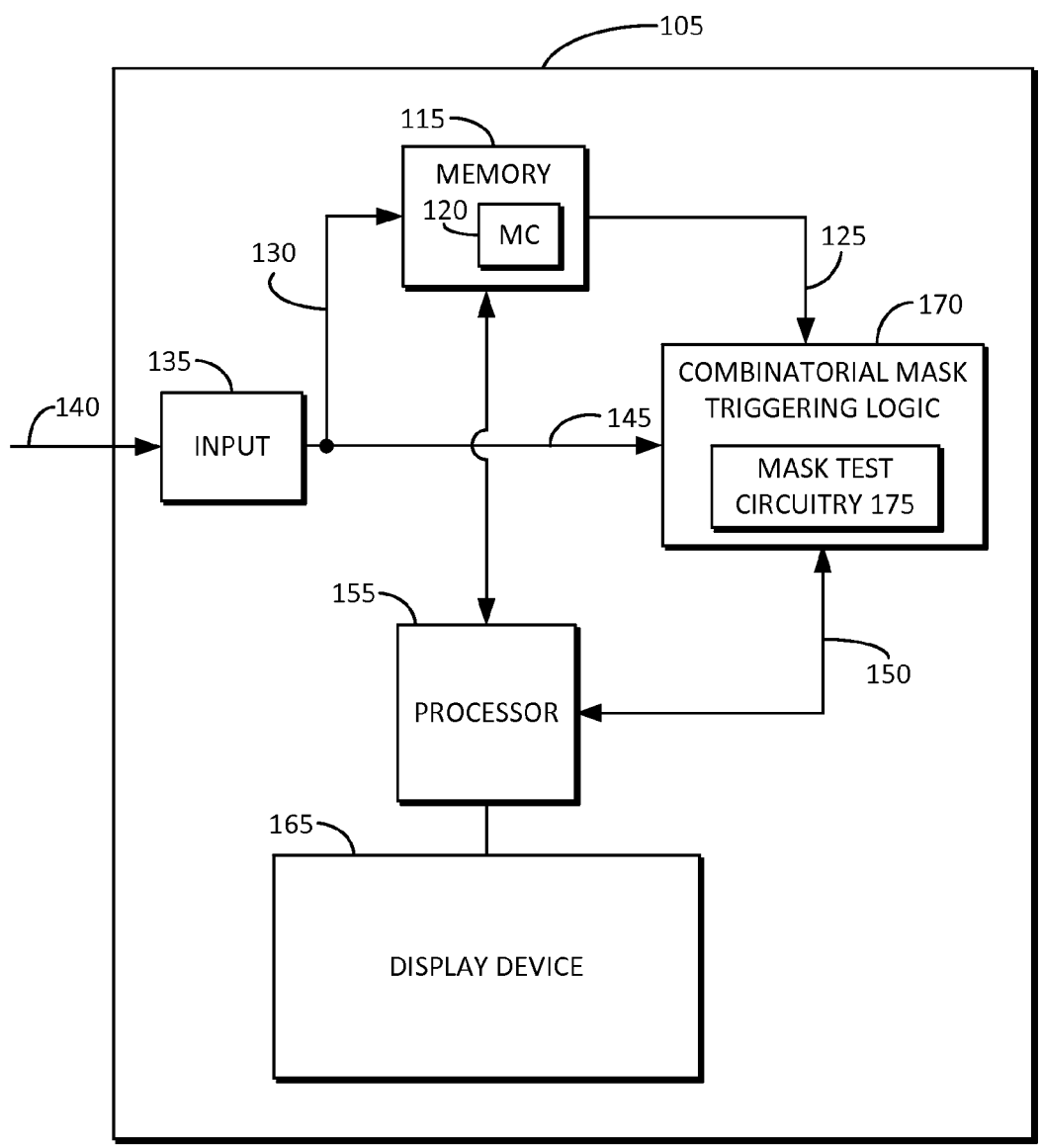
FIG. 1 illustrates an example test and measurement instrument including combinatorial mask triggering logic in accordance with embodiments of the present invention.

FIG. 1 illustrates an example test and measurement instrument 105 including combinatorial logic 170 in accordance with embodiments of the present invention. The test and measurement instrument 105 can be an oscilloscope, a logic analyzer, a spectrum analyzer, a mixed-domain oscilloscope, a network analyzer, or the like. Generally, for the sake of consistency and explanation, the test and measurement instrument 105 is referred to herein as an oscilloscope.

The oscilloscope 105 can include an input section 135, which receives an input electrical signal under test 140. The input section 135 can include acquisition circuitry, digitizers, amplifiers, converters, or the like, and can be connected to a memory 115 via line 130. The memory 115 can store one or more acquisition records related to the input signal 140 in response to a trigger event. The memory 115 can include a memory controller 120, which controls the writing and reading of digitized data to and from the memory 115. The memory 115 can be dynamic memory, static memory, read-only memory, random-access memory, or any other suitable variety of memory. The memory 115 can store digital data, which can be displayed on a display device 165.

The input section 135 may also be coupled to the combinatorial logic 170 via line 145 so that the combinatorial logic 170 can receive the input signal 140. The combinatorial logic 170 may also receive digitized data from the memory 115 via line 125. The term "combinatorial mask triggering logic" or "combinatorial logic" refers to analog circuits, digital circuits, hardware circuits, firmware, and/or software, or any suitable combination thereof, for processing an input signal and producing a trigger signal based on a predefined set of criteria.

The combinatorial mask triggering logic 170 may process the digital data received at input in real-time and generate a trigger signal 150 upon occurrence of a trigger event. The combinatorial mask triggering logic 170 may include mask test circuitry 175, and may trigger the oscilloscope 105 based on criteria determined at least in part by the mask test circuitry 175. The mask test circuitry 175 can determine in real-time whether pixels that are associated with the digital data and drawn on the display device 165 bear a predefined relationship to a trigger mask in terms of space and time, as further described below. Moreover, the combinatorial mask triggering logic 170 and mask test circuitry 175 can process the input signal and make such determinations in the frequency domain, time domain, or both. Example embodiments of the functioning and other aspects of the combinatorial mask triggering logic 170 are described below.

A processor 155 may be coupled to the combinatorial mask triggering logic 170 and may receive the trigger signal 150. The processor 155 may also be coupled to the display 165. The processor 155 may coordinate the processing of data between the input 135, the combinatorial logic 170, the memory 115, and the display 165, and may cause trigger information, waveform information, and/or other measurement information to be displayed on the display 165.

Figure 2:
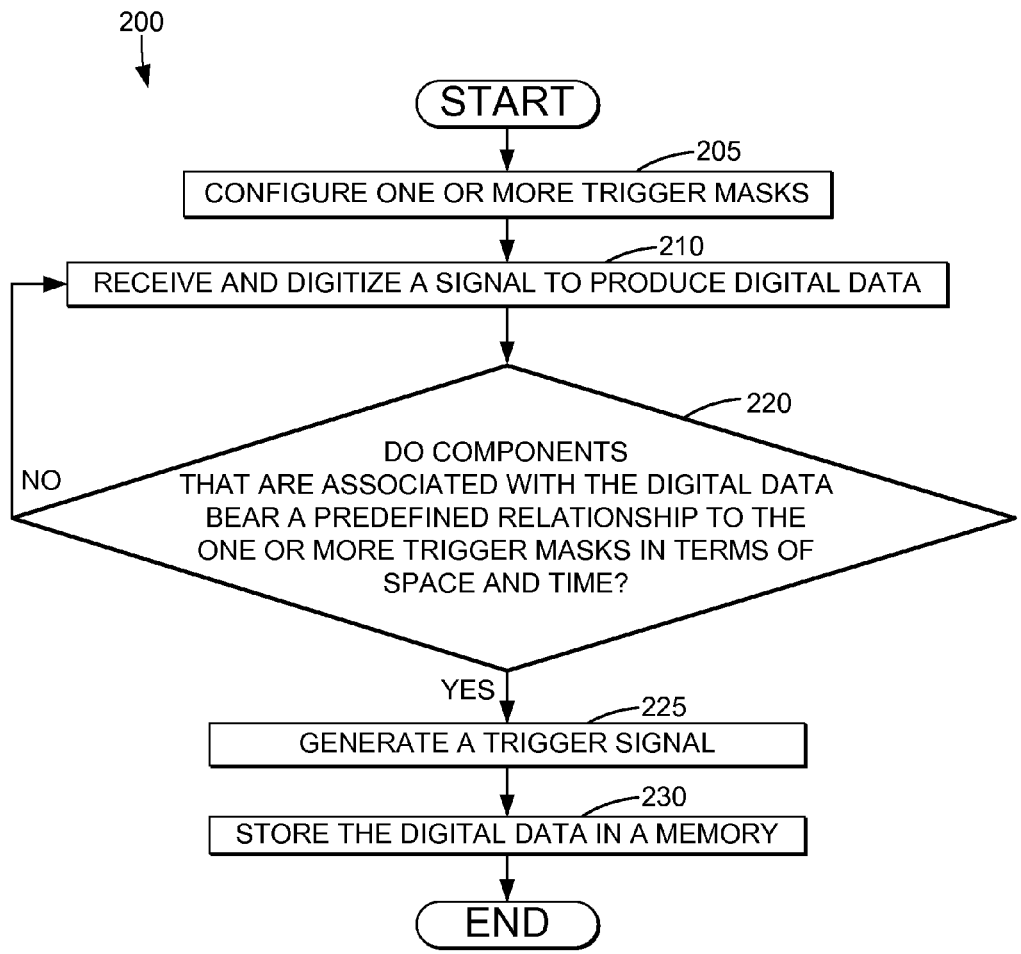
FIG. 2 illustrates a flow diagram showing a technique for combinatorial mask triggering in terms of space and time in accordance with embodiments of the present invention.

FIG. 2 illustrates a flow diagram 200 showing a technique for combinatorial mask triggering in terms of space and time in accordance with embodiments of the present invention. The technique may begin at 205 where one or more trigger masks are configured. A "trigger mask" is a mask region defined relative to the drawing plane of the display device 165 (of FIG. 1). The combinatorial mask triggering logic 170 (of FIG. 1) can determine whether a waveform intersects the trigger mask or mask region, or otherwise bears a predefined relationship to the trigger mask or mask region. Although the trigger mask(s) are primarily represented herein as rectangular in shape, it will be understood that the trigger mask(s) may be circular, triangular, linear, or any other suitable shape and size. In the example embodiments described herein, the one or more trigger masks may be configured manually or visually by a user of the oscilloscope, for example, using any suitable input means such as a keyboard, mouse, touch screen, and the like. Alternatively, the one or more trigger masks may be automatically configured by the oscilloscope. The oscilloscope may configure the one or more trigger masks based on previously stored criteria. In addition, the one or more trigger masks can be made using software on an external computer system and then imported into the oscilloscope.

The flow proceeds to 210, where the input signal is received and digitized to produce digital data. A determination is made at 220 whether pixels or components that are associated with the digital data bear a predefined relationship to one or more trigger masks in terms of space and time. If so, then a mask failure occurs, and the combinatorial logic 170 (of FIG. 1) generates a trigger signal at 225, which triggers the oscilloscope, thereby causing the incoming signal and associated digital data to be stored, at step 230, in the memory 115 (of FIG. 1).

Making the determination of whether the pixels or components bear the predefined relationship can include, for example, determining whether the pixels or components associated with the digital data would violate one or more trigger masks if drawn on the display of the display device. If no mask violation occurs, the digital data is discarded and more is acquired.

Figure 3A:
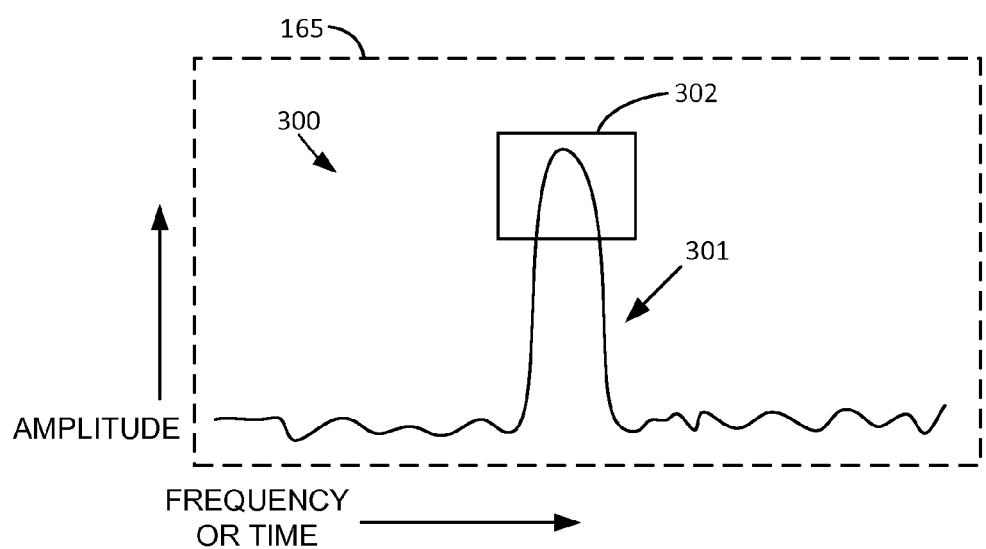
FIGS. 3A-3B illustrate a trace and an associated flow diagram, respectively, in accordance with an embodiment of the present invention.
Figure 3B:
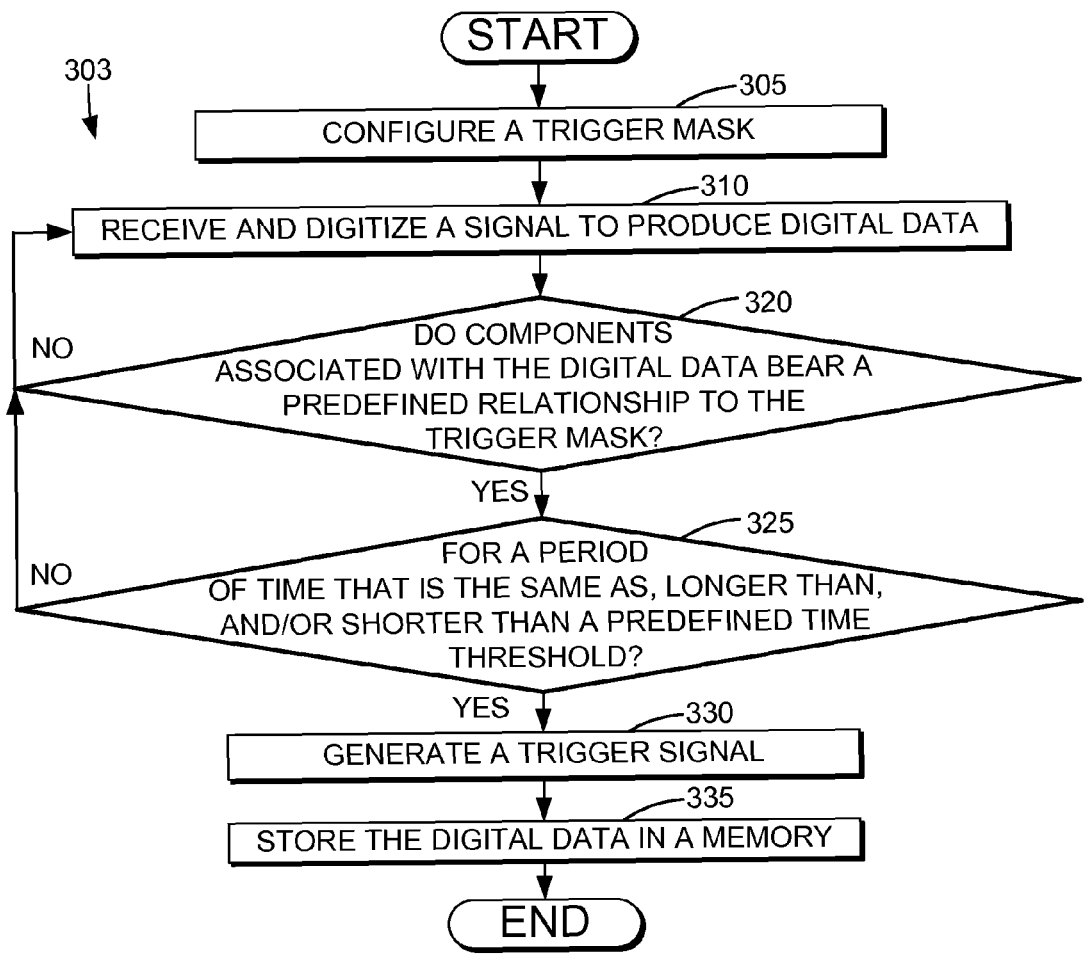

FIGS. 3A-3B illustrate a trace 300 and an associated flow diagram 303, respectively, in accordance with an embodiment of the present invention. The horizontal axis of the spectrum trace 300 (and other spectrum traces described and illustrated herein) can be expressed or measured in terms of frequency when analyzing the input signal in the frequency domain, or in terms of time when analyzing the input signal in the time domain. The vertical axis can be expressed or measured in terms of amplitude or power. This description of the axes also applies to the plots and traces discussed below.

At 305 of the flow diagram 303, a trigger mask 302 can be configured. At 310, the input signal is received and digitized to produce digital data.

A determination is made at 320 whether pixels or components (e.g., 301) associated with the digital data bear a predefined relationship in space to the trigger mask 302. The predefined relationship can be, for example, an excursion into, through, and/or out of the trigger mask 302. The excursion can be caused by, for example, the main signal, a glitch in the signal, or some other spurious signal. Another determination is made at 325 whether the predefined relationship is present for a period of time that is the same as, longer than, and/or shorter than a predefined time threshold. In other words, if the pixels or components are detected to cause an excursion and dwell within the associated trigger mask for the period of time that is the same as the predefined time threshold, longer than the predefined threshold, shorter than the predefined threshold, or any combination thereof, then a mask failure occurs and the flow proceeds along the YES path.

The determinations made at 320 and 325 can be made as a single combined logical determination based on the space and time factors. If either of the conditions is not met, the flow returns to 310 for further processing. Otherwise, the flow proceeds to 330, where a trigger signal is produced in response to the satisfied trigger criteria, and then to 335, where the digital data associated with the incoming signal is stored to the memory.

A representation 301 of the digital data can be displayed as a spectrum trace in the frequency domain on a display of the display device 165, or as a trace in the time domain on the display of the display device 165. It will be understood that the while the representation 301, and other representations of digital data illustrated and described herein, often show a single waveform or line, this is to aid in a more simple and direct illustration and explanation, and any number of frequency components, time domain components, waveforms, shapes, lines, traces, and the like, can be present and otherwise drawn on the display device, and processed by the combinatorial mask triggering logic, and still fall within the scope of the inventive techniques described herein.

Figure 4A:
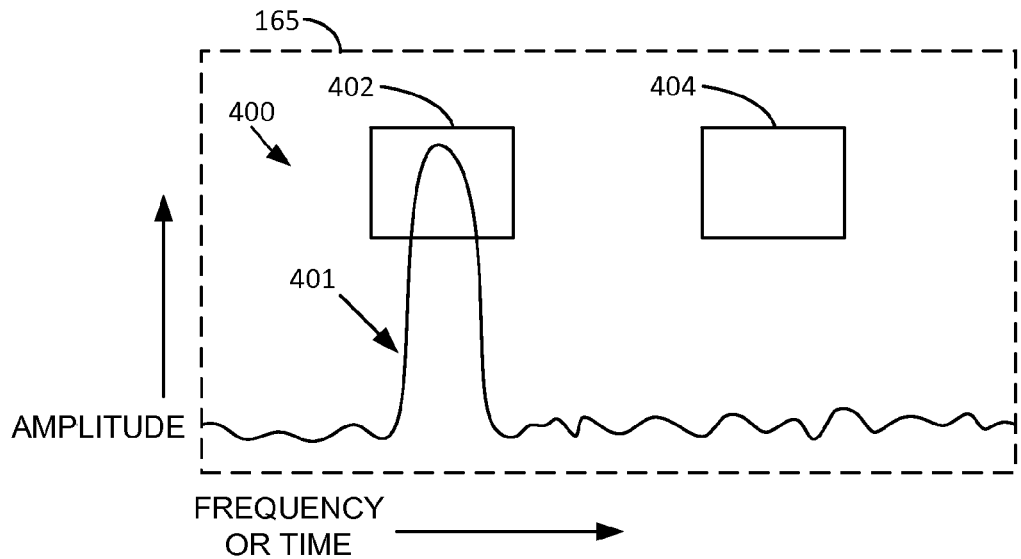
FIGS. 4A-4C illustrate a first trace, a second trace, and an associated flow diagram, respectively, in accordance with another embodiment of the present invention.
Figure 4B:
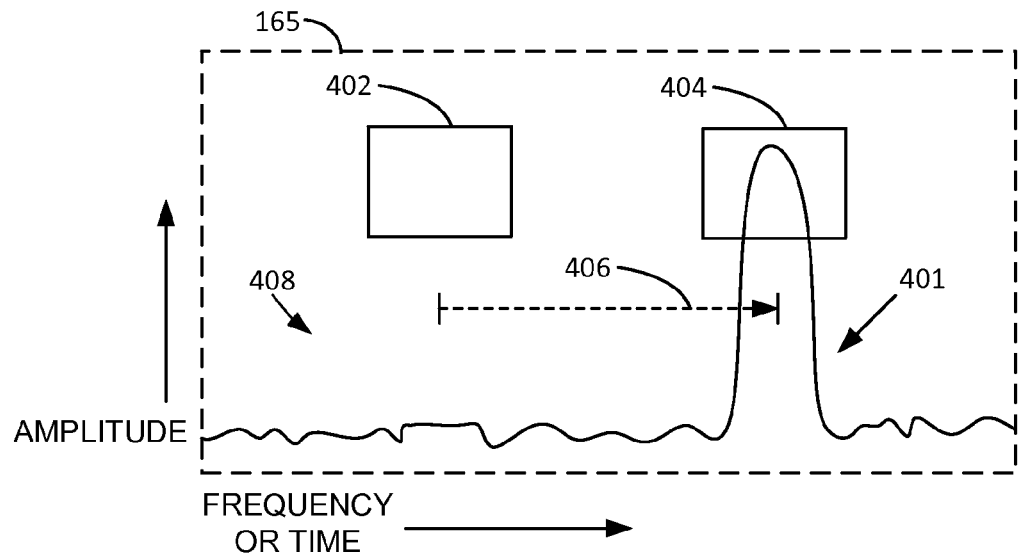
Figure 4C:
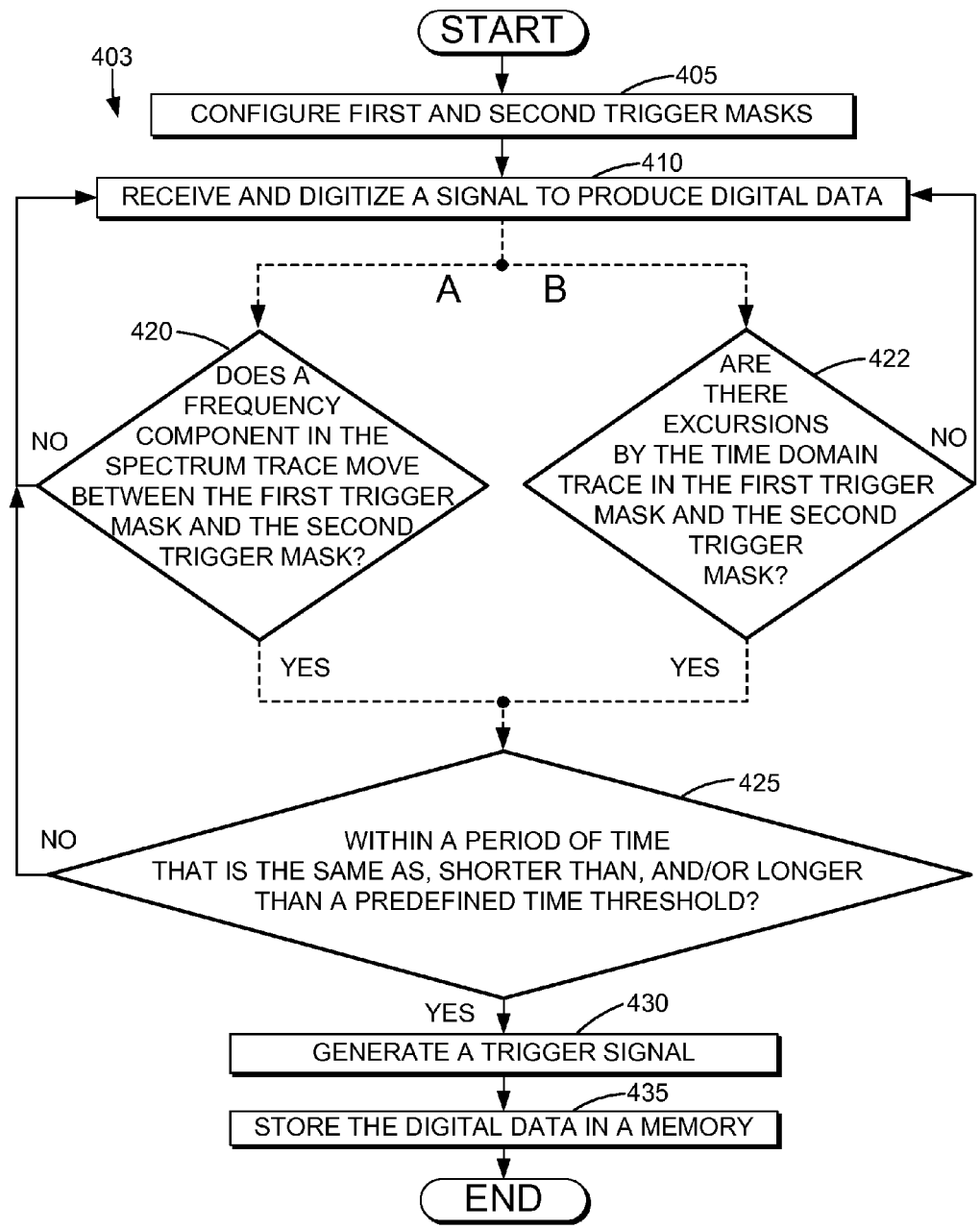

FIGS. 4A-4C illustrate a first trace 400, a second trace 408, and an associated flow diagram 403, respectively, in accordance with another embodiment of the present invention. When operating within the frequency domain, the spectrum traces 400 and 408 represent frequency components 401 shifting or moving in time. When operating within the time domain, the traces 400 and 408 represent time domain components appearing at different times. The technique may begin at 405, where a first trigger mask 402 and a second trigger mask 404 are configured. The flow proceeds to 410 where the input signal is received and digitized to produce digital data.

Thereafter, either of paths A or B can be taken. Path A indicates an operation being performed within the frequency domain while path B indicates an operation being performed within the time domain. If path A is taken, the flow proceeds to 420 where a determination is made whether one or more frequency components (e.g., 401) in the spectrum trace move between the first trigger mask 402 and the second trigger mask 404. Conversely, if path B is taken, the flow proceeds to 422 where a determination is made whether there are excursions by the time domain trace into, through, and/or out of the first trigger mask 402 and the second trigger mask 404. The excursions need not occur simultaneously, but rather, can occur sequentially. As mentioned above, the excursions can be caused by, for example, the main signal, glitches in the signal, or other spurious signals.

In either case (path A or path B), the flow returns to 425, where another determination can be made whether the movement or excursions occur within a period of time 406 that is the same as, shorter than, and/or longer than a predefined time threshold. In other words, if the pixels or components are detected to cause an excursion or failure relative to the first trigger mask, and then within a period of time thereafter, the pixels or components are detected to cause an excursion or failure relative to the second trigger mask, in which the period of time is the same as the predefined time threshold, longer than the predefined threshold, shorter than the predefined threshold, or any combination thereof, then the flow proceeds along the YES path.

The determinations made at 420, 422 and/or 425 can be made as a single combined logical determination based on the space and time factors. If either of the conditions is not met, the flow returns to 410 for further processing. Otherwise, the flow proceeds to 430, where a trigger signal is produced in response to the satisfied trigger criteria, and then to 435, where the digital data associated with the incoming signal is stored to the memory.

In an alternative embodiment, the flow skips step 425. In other words, if path A is taken, the oscilloscope can be triggered if frequency components are present within the first trigger mask 402 and the second trigger mask 404, without respect to time. If path B is taken in this scenario, the oscilloscope can be triggered if components of the time domain trace are present within the first trigger mask 402 and the second trigger mask 404, without respect to time.

When operating in the frequency domain, a representation 401 of the digital data can be displayed as a spectrum trace on a display of the display device 165. When operating in the time domain, a representation 401 of the digital data can be displayed as a time domain trace on the display of the display device 165.

Figure 5A:
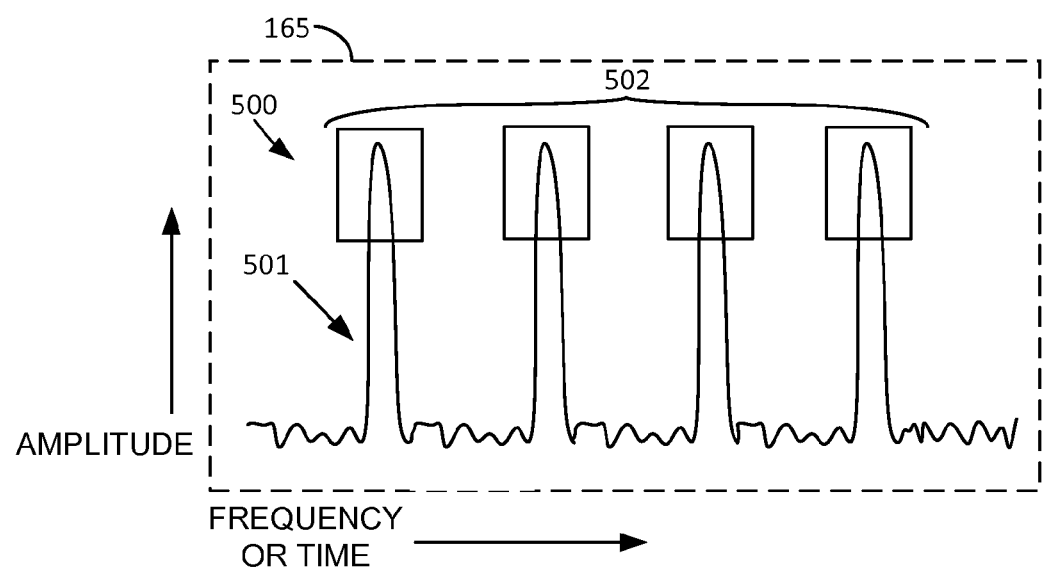
FIGS. 5A-5B illustrate a trace and an associated flow diagram, respectively, in accordance with yet another embodiment of the present invention.
Figure 5B:
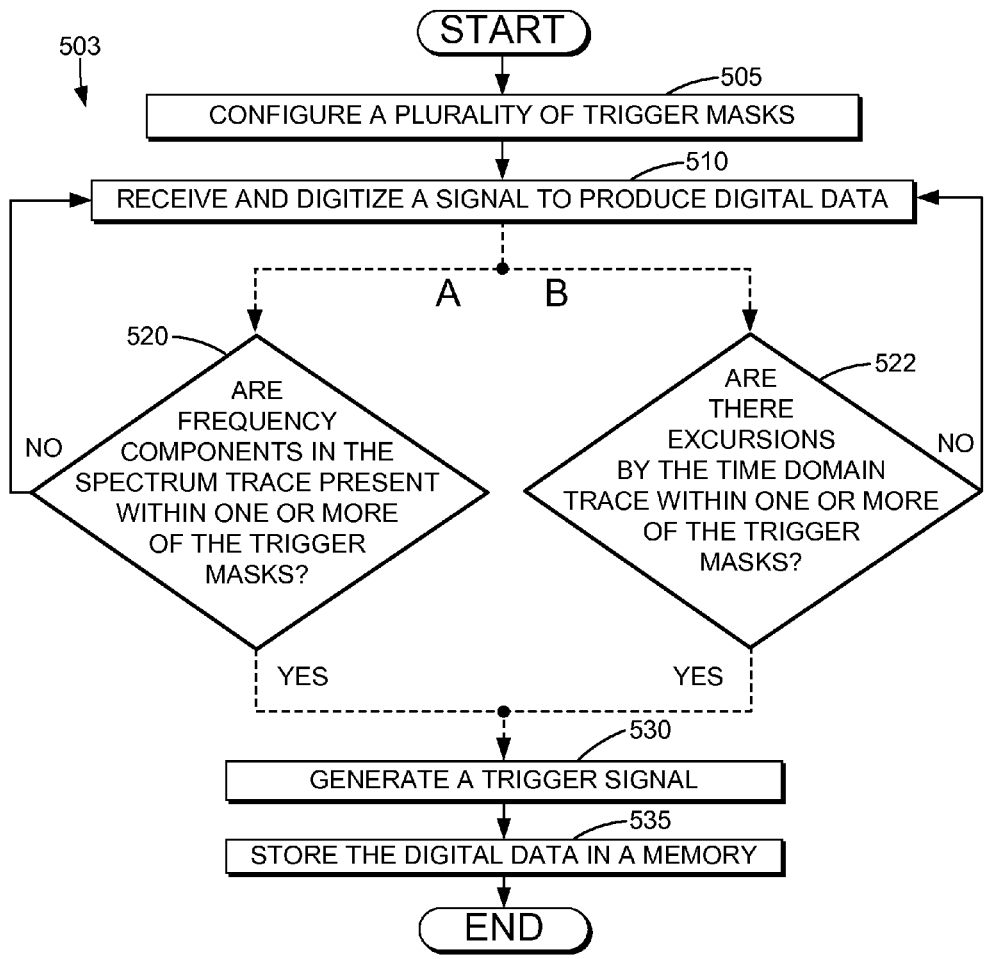

FIGS. 5A-5B illustrate a trace 500 and an associated flow diagram 503, respectively, in accordance with yet another embodiment of the present invention. The technique may begin at 505 where a plurality of trigger masks 502 are configured. The flow proceeds to 510 where the input signal is received and digitized to produce digital data.

Thereafter, either of paths A or B can be taken. Path A indicates an operation being performed within the frequency domain while path B indicates an operation being performed within the time domain. If path A is taken, the flow proceeds to 520 where a determination is made whether frequency components (e.g., 501) in the spectrum trace are present within one or more of the trigger masks 502. Conversely, if path B is taken, the flow proceeds to 522 where a determination is made whether there are excursions by the time domain trace into, through, and/or out of one or more of the trigger masks 502.

Such determinations can be combined with a determination (not shown) of whether the pixels or components 501 are present within the one or more trigger masks 502 and dwell for a time period that is the same as, longer than, and/or shorter than a predefined time threshold. By way of another example, the determination can be whether the pixels or components 501 are present within 2 of the 4 trigger masks 502, or 3 of the 4 trigger masks 502, and so forth. If the condition(s) are not met, the flow returns to 510 for further processing. Otherwise, the flow proceeds to 530, where a trigger signal is produced in response to the satisfied trigger criteria, and then to 535, where the digital data associated with the incoming signal is stored to the memory.

When operating in the frequency domain, a representation 501 of the digital data can be displayed as a spectrum trace on the display of the display device 165. For example, the spectrum trace may show a representation 501 of a frequency hopping signal. When operating in the time domain, a representation 501 of the digital data can be displayed as a time domain trace on the display of the display device 165.

Figure 6A:
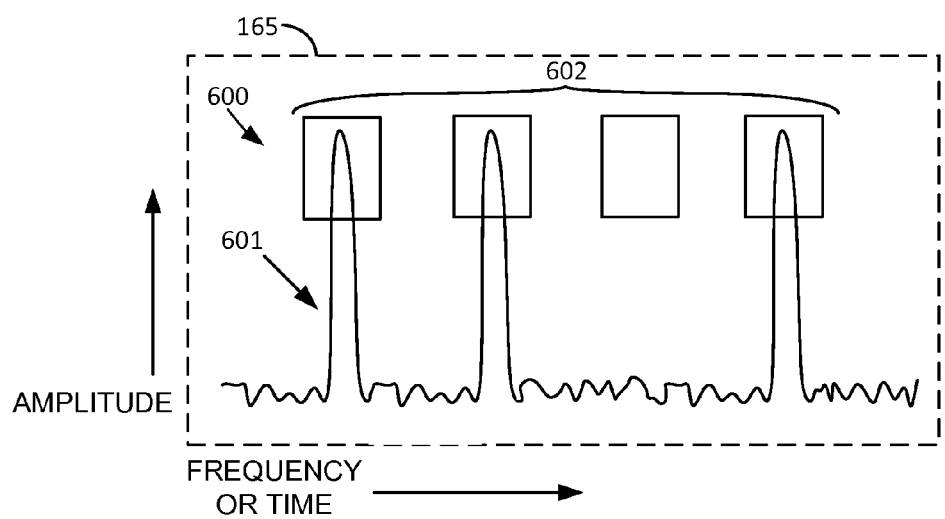
FIGS. 6A-6B illustrate a trace and an associated flow diagram, respectively, in accordance with still another embodiment of the present invention.
Figure 6B:
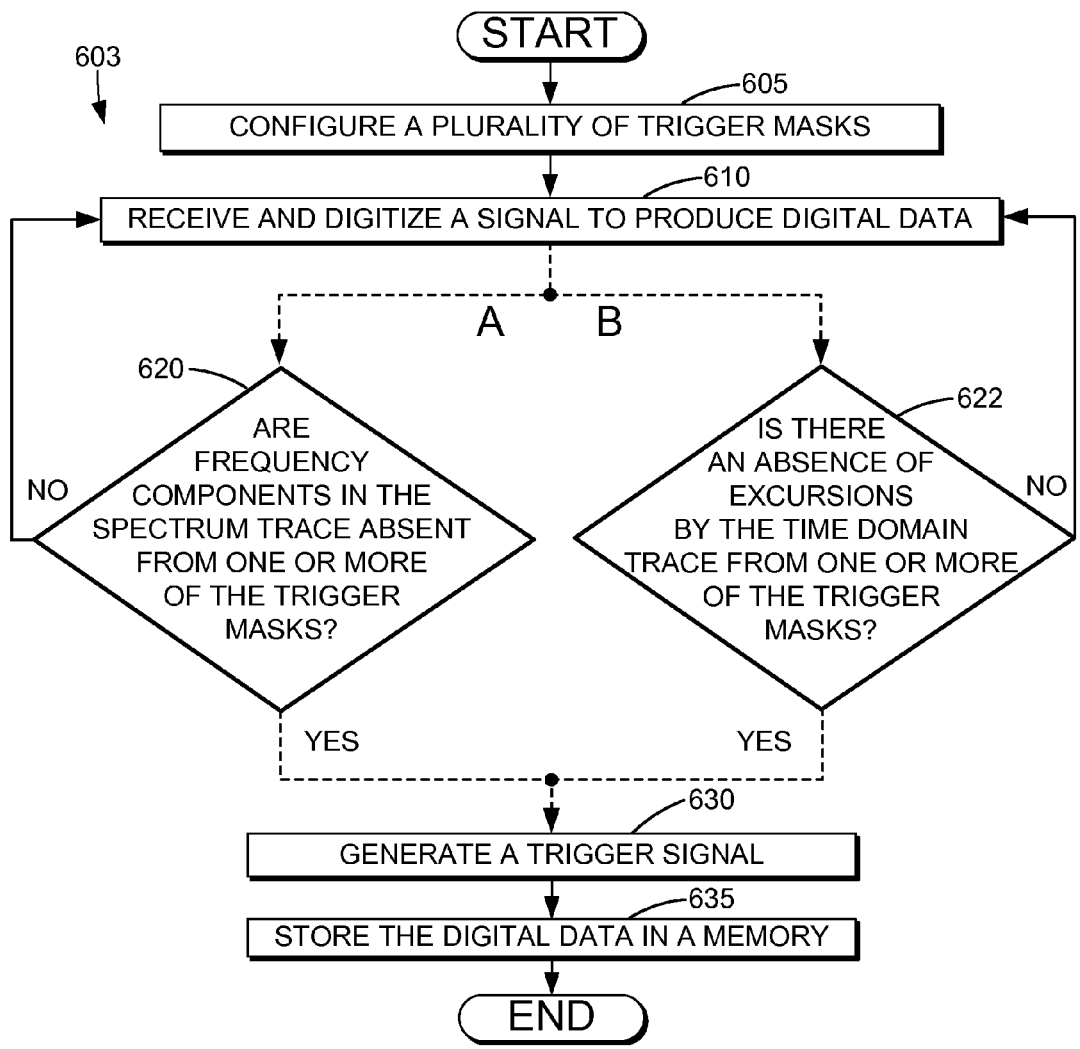

FIGS. 6A-6B illustrate a trace 600 and an associated flow diagram 603, respectively, in accordance with still another embodiment of the present invention. The technique may begin at 605 where a plurality of trigger masks 602 are configured. The flow proceeds to 610 where the input signal is received and digitized to produce digital data.

Thereafter, either of paths A or B can be taken. Path A indicates an operation being performed within the frequency domain while path B indicates an operation being performed within the time domain. If path A is taken, the flow proceeds to 620 where a determination is made whether frequency components (e.g., 601) in the spectrum trace are absent from one or more of the trigger masks 602. Conversely, if path B is taken, the flow proceeds to 622 where a determination is made whether there is an absence of excursions by the time domain trace from one or more of the trigger masks 502.

Such a determinations can be combined with a determination (not shown) of whether the pixels or components 601 are absent from the one or more trigger masks 602 for a time period that is the same as, longer than, and/or shorter than a predefined time threshold. By way of another example, the determination can be whether the pixels or components 601 are absent from 2 of the 4 trigger masks 602, or 3 of the 4 trigger masks 602, and so forth. If the condition(s) are not met, the flow returns to 610 for further processing. Otherwise, the flow proceeds to 630, where a trigger signal is produced in response to the satisfied trigger criteria, and then to 635, where the digital data associated with the incoming signal is stored to the memory.

A time relationship can also be used as part of the trigger criteria in this embodiment. For example, if there are no pixels or components (e.g., 601) of the signal that are present in any one or more of the trigger masks for a period of time that is the same as, longer than, or shorter than a predefined time threshold, then the trigger criteria can be satisfied, and the trigger signal generated.

When operating in the frequency domain, a representation 601 of the digital data can be displayed as a spectrum trace on the display of the display device 165. For example, the spectrum trace may show a representation 601 of a frequency hopping signal. When operating in the time domain, a representation 601 of the digital data can be displayed as a time domain trace on the display of the display device 165.

FIGS. 7A-7D illustrate a first trace 700, a second trace 705, an associated flow diagram 703 relative to the frequency domain, and an associated flow diagram 803 relative to the time domain, respectively, in accordance with another embodiment of the present invention.

Figure 7A:
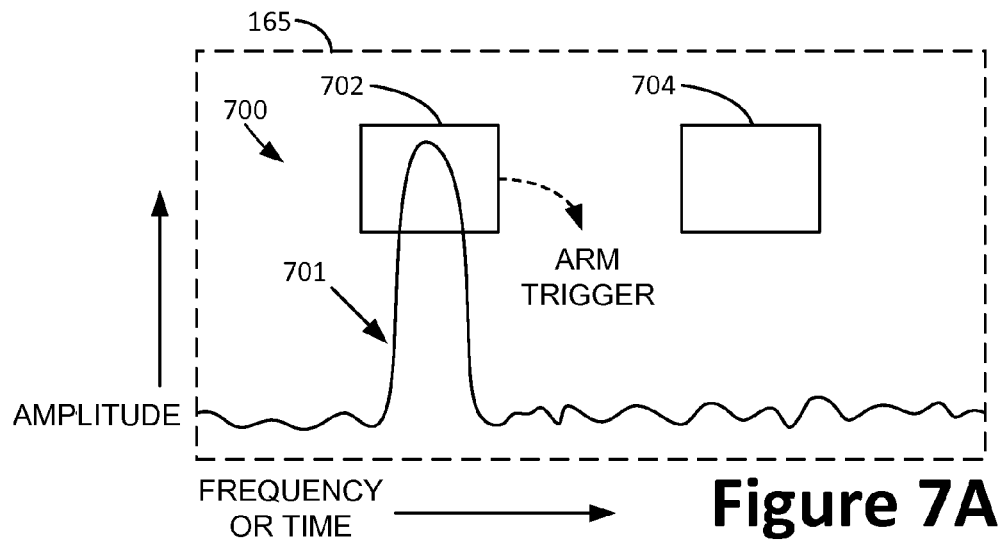
FIGS. 7A-7D illustrate a first trace, a second trace, an associated flow diagram relative to the frequency domain, and an associated flow diagram relative to the time domain, respectively, in accordance with another embodiment of the present invention.
Figure 7B:
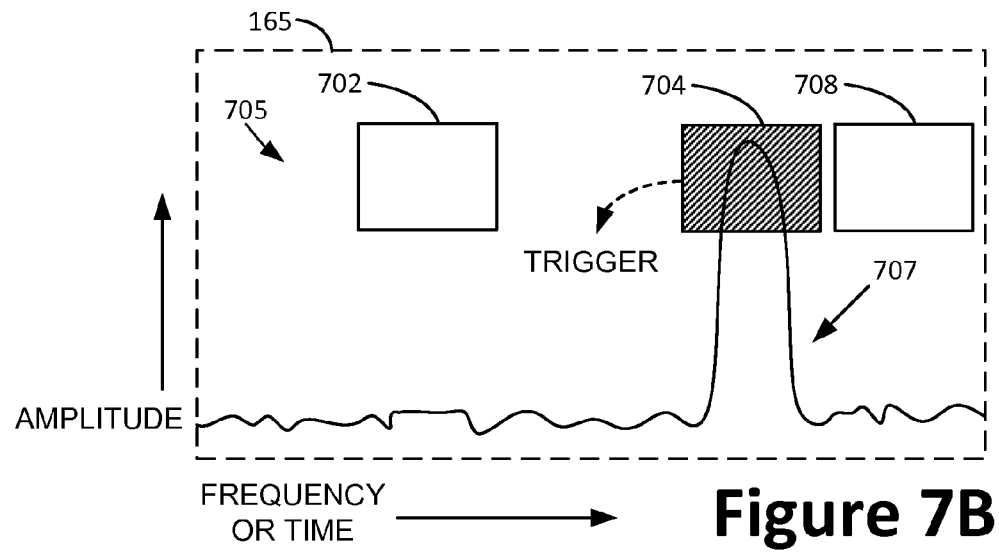
Figure 7C:
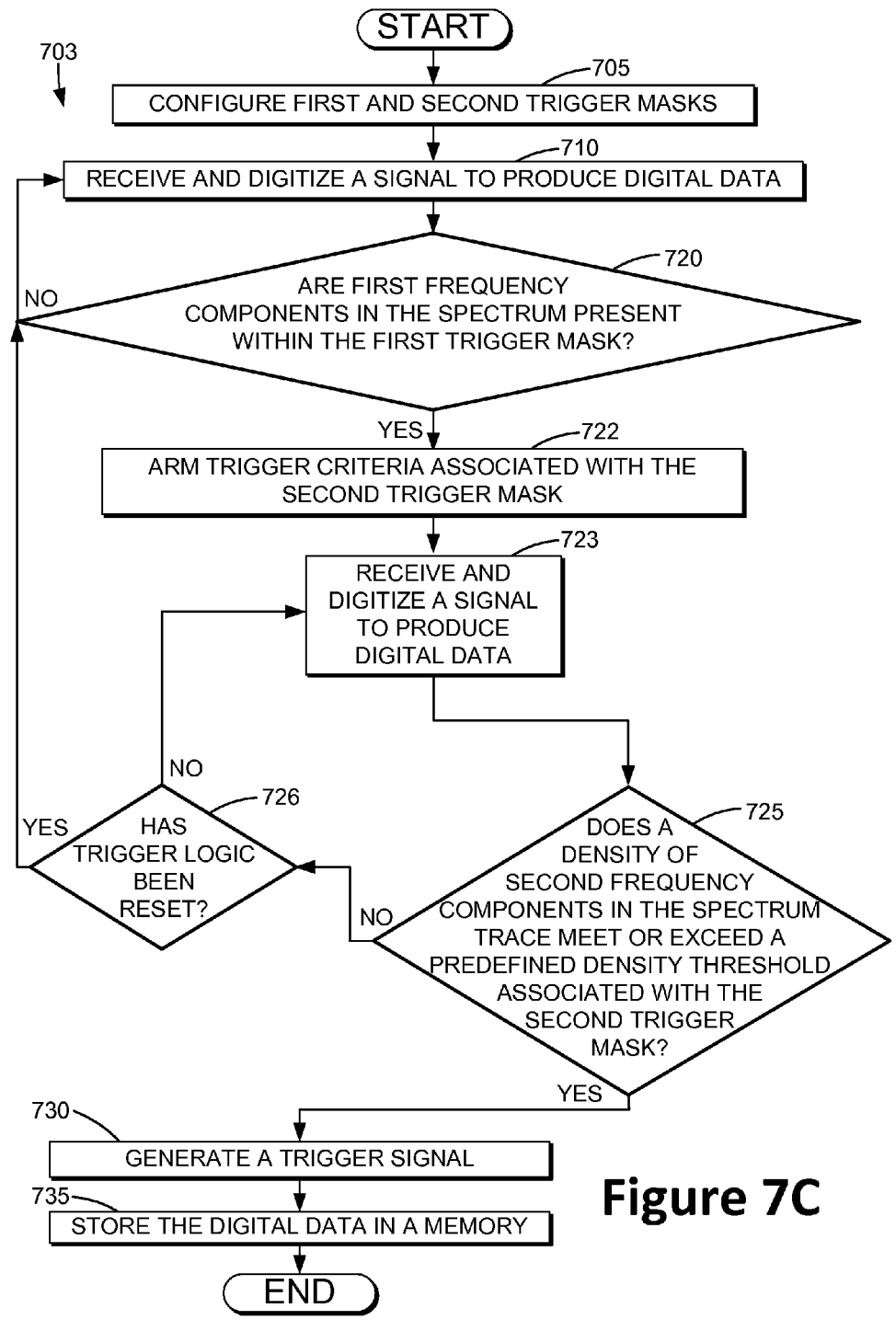

Referring to FIGS. 7A, 7B, and 7C, it is assumed that the traces 700 and 705 are spectrum traces within the frequency domain. The technique may begin at 705, where a first trigger mask 702 and a second trigger mask 704 are configured. The flow proceeds to 710 where the input signal is received and digitized to produce digital data.

A determination is made at 720 whether first frequency components 701 in the spectrum trace are present within the first trigger mask 702. If NO, the flow returns to 710 for further data acquisition. Otherwise, if YES, then trigger can be armed at 722, or in other words, the combinatorial mask triggering logic 170 (of FIG. 1) can arm trigger criteria associated with the second trigger mask 704. Once the trigger is armed, the system continues to acquire and digitize data at 723 looking for a second trigger mask failure. To detect the second trigger mask failure, another determination can be made at 725 whether a density value of second frequency components 707 in the spectrum trace meet or exceed a predefined density threshold associated with the second trigger mask 704. If YES, then flow proceeds to 730, where a trigger signal is produced in response to the satisfied trigger criteria, and then to 735, where the digital data associated with the incoming signal is stored to the memory. Otherwise, if NO, then the flow proceeds to 726, where yet another determination is made whether the trigger logic has been reset. If the trigger logic has been reset, then the flow returns to 710 for further processing. Otherwise, if the trigger logic has not been reset, then the flow returns 723 for further data acquisition. The reset can come from a user request or from a reset indicator within the digital data.

The "density value" can equal the number of "hits" or "excursions" or "pixels" drawn within the associated trigger mask divided by the number of waveforms used to generate it. As used herein, a mask failure can be either a "one time" event (i.e., occurring when a single waveform violates a mask region) or a "statistical" event (i.e., occurring when there have been a certain number of mask failures over a specified time period—typically one frame). Put differently, the term "mask failure" as used herein applies to either a one-time (mask) failure or a statistical (density) failure.

In some embodiments, three trigger masks (e.g., 702, 704, and 708) can be used by the combinatorial mask triggering logic. For example, a determination can be made whether an excursion or failure occurs with respect to trigger mask 702, which can cause trigger criteria to be armed for trigger mask 704. The oscilloscope can then be triggered in response to an excursion or failure of the trigger mask 704 unless an excursion happens first with respect to the trigger mask 708. Any suitable combination of trigger masks with respect to space and time, and combinatorial logic, can be used to trigger the oscilloscope. As mentioned above, the excursions can be caused by, for example, the main signal, glitches in the signal, or other spurious signals.

In an alternative embodiment, the trigger criteria associated with trigger mask 704 is not related to density, but rather, the presence or excursion of frequency components, similar to the examples above. In other words, the combinatorial mask trigger logic can use trigger masks 702, 704, and/or 708 (in addition to still other trigger masks) to build a sequence of events based on the presence of pixels or components within the trigger masks, with the added option of timing relationships similar to those described above, by which ultimately the trigger criteria is met and the trigger signal generated.

When operating in the frequency domain, a representation (e.g., 701) of the digital data can be displayed as a spectrum trace on the display of the display device 165.

Figure 7D:
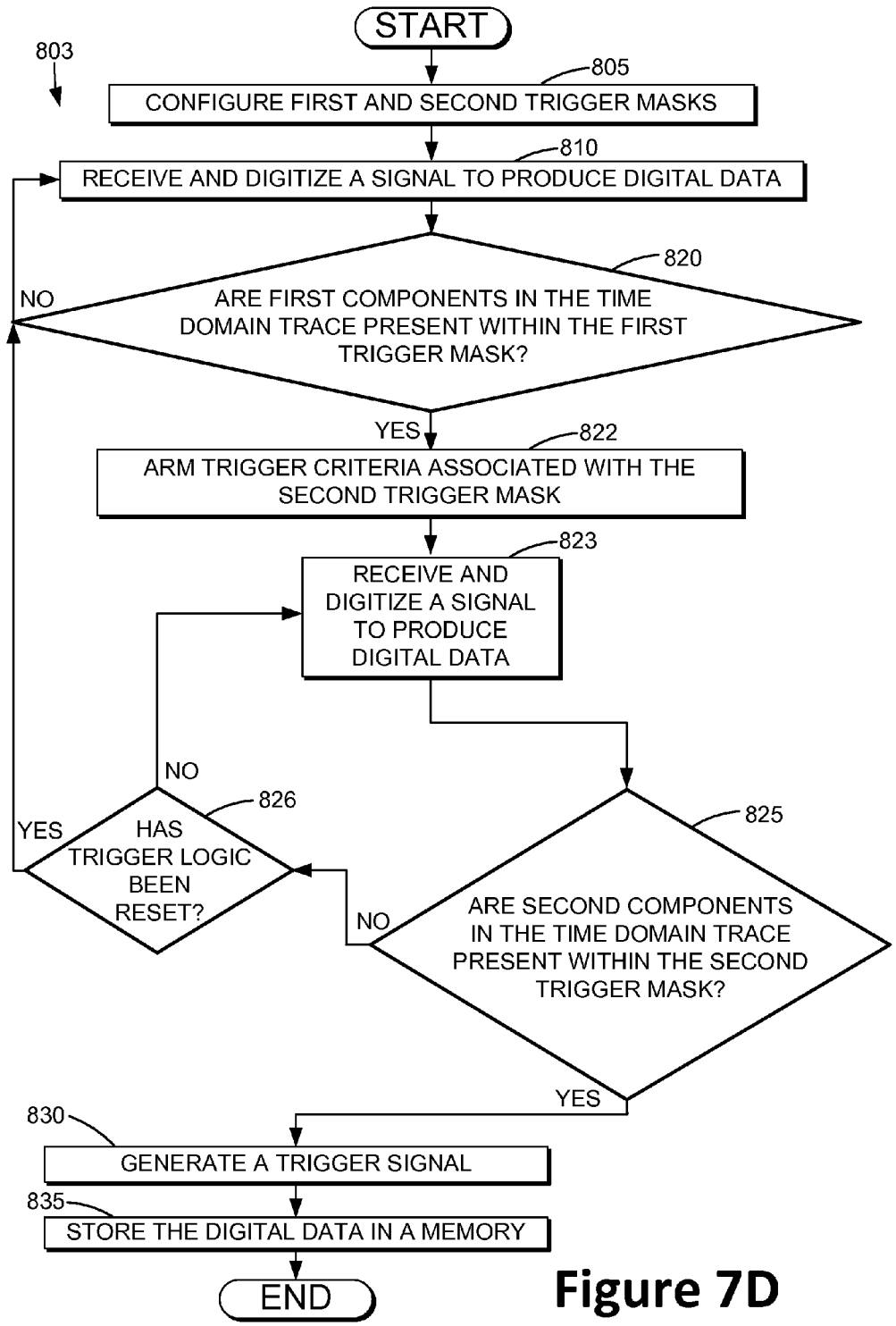

Referring now to FIGS. 7A, 7B, and 7D, it is assumed that the traces 700 and 705 are spectrum traces within the time domain. The technique may begin at 805, where a first trigger mask 702 and a second trigger mask 704 are configured. The flow proceeds to 810 where the input signal is received and digitized to produce digital data.

A determination is made at 820 whether first components 701 in the time domain trace are present within the first trigger mask. If NO, the flow returns to 810 for further data acquisition. Otherwise, if YES, then trigger can be armed at 822, or in other words, the combinatorial mask triggering logic 170 (of FIG. 1) can arm trigger criteria associated with the second trigger mask 704. Once the trigger is armed, the system continues to acquire and digitize data at 823 looking for a second trigger mask failure. To detect the second trigger data, another determination can be made at 825 whether second components 707 in the time domain trace are present within the second trigger mask 704. If YES, then flow proceeds to 830, where a trigger signal is produced in response to the satisfied trigger criteria, and then to 835, where the digital data associated with the incoming signal is stored to the memory. Otherwise, if NO, then the flow proceeds to 826, where yet another determination is made whether the trigger logic has been reset. If the trigger logic has been reset, then the flow returns to 810 for further data acquisition. Otherwise, if the trigger logic has not been reset, then the flow returns 823 for further data acquisition. The reset can come from a user request or from a reset indicator within the digital data.

Alternatively, three trigger masks (e.g., 702, 704, and 708) can be used by the combinatorial mask triggering logic in the time domain. For example, a determination can be made whether an excursion occurs with respect to trigger mask 702, which can cause trigger criteria to be armed for trigger mask 704. The oscilloscope can then be triggered in response to an excursion of the trigger mask 704 unless an excursion happens first with respect to the trigger mask 708. Any suitable combination of trigger masks with respect to space and time, and combinatorial logic, can be used to trigger the oscilloscope.

In an alternative embodiment, timing relationships between the mask failures are used to determine whether to generate the trigger signal. When a timing relationship is used, for example, the combinatorial mask triggering logic can determine whether the second components (e.g., 707) that are associated with the digital data bear the predefined relationship (e.g., an excursion and/or a dwelling within) to the second trigger mask (e.g., 704) within a predefined period of time after the first components (e.g., 701) that are associated with the digital data are determined to bear the predefined relationship with the first trigger mask (e.g., 702).

In an alternative embodiment, the trigger criteria associated with trigger mask 704 is not based solely on the presence or dwelling of components, but rather, it can also be based on the density of components, similar to the examples above. In other words, the combinatorial mask trigger logic can use trigger masks 702, 704, and/or 708 (in addition to still other trigger masks) to build a sequence of events based on the presence and/or density of pixels or components within the trigger masks, with the added option of timing relationships similar to those described above, by which ultimately the trigger criteria is met and the trigger signal generated.

When operating in the time domain, a representation (e.g., 701) of the digital data can be displayed as a time domain trace on the display of the display device 165.

The combinatorial and sequential criteria that combines both space and time elements, as discussed herein, can be implemented in either the frequency domain, the time domain, or both. It will be understood that the determinations and other steps in the flow diagrams need not occur in the specific order as described, but rather, these determinations can be made at different times. It will also be understood that the steps described in these techniques need not necessarily occur in the order as illustrated or described.

Although the foregoing discussion has focused on particular embodiments, other configurations are contemplated. For example, the combinatorial mask triggering logic 170 (of FIG. 1) can determine whether at least one trigger mask experiences a failure (e.g., excursion into, out of, or through the trigger mask) every N seconds, and if so, trigger the oscilloscope. By way of another example, the combinatorial mask triggering logic 170 can determine whether at least one trigger mask experiences a failure (e.g., excursion into, out of, or through the trigger mask) at least X times per second, and if so, trigger the oscilloscope.

As explained above, the combinatorial mask triggering logic 170 can cause the oscilloscope to be triggered when a glitch or other component is present in a waveform for a certain period of time, or when it isn't present for a specified period of time.

In the time domain, the combinatorial mask triggering logic 170 can cause the oscilloscope to be triggered when glitches in a trace occur at a certain rate. The combinatorial mask triggering logic 170 can cause the oscilloscope to be triggered when one glitch (defined by one trigger mask region) occurs within a certain time period after a glitch defined by another trigger mask region.

In the frequency domain, the combinatorial mask triggering logic 170 can cause the oscilloscope to be triggered when a spurious component or other frequency component dwells in, or is absent from, a trigger mask region for too long, or too quickly. The combinatorial mask triggering logic 170 can cause the oscilloscope to be triggered when one or more frequency components in a spectrum trace move between one trigger mask region and another too quickly, or too slowly. The combinatorial mask triggering logic 170 can cause the oscilloscope to be triggered when certain spectral components are present in a spectrum trace, but others are absent. The combinatorial mask triggering logic 170 can arm a trigger with a frequency excursion into one trigger mask region, and then trigger when the density is exceeded in another region. The trigger can be limited to cases when the density excursion occurs only within a certain time region after the arming event.

Because the combinatorial mask triggering logic 170 may include and utilize the mask test circuitry 175, such circuitry can catch intermittent events that might never be seen by a purely software implementation. While the embodiments herein need not include a hardware implementation, such an implementation can increase the speed by which the inventive functionality is performed.

The various embodiments disclosed herein can recognize "hits" or "excursions" of pixels relative to one or more of the trigger mask regions. The hits or excursions can be combined in multiple regions, together with flexible logic, to create more complex mask failure criteria. Timing relationships between the mask failures can be established and/or chained into a sequence of events. The number of complex mask failures can be counted over a specified time period. These capabilities can be implemented in hardware as the failures occur (i.e., in real-time), or can be implemented in software. A hybrid of hardware and software can be used, such as providing a hardware "flag" when a trigger mask failure occurs, which notifies the software to process the failure.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access. Embodiments of the inventive concept may include a non-transitory machine-readable medium comprising instructions executable by one or more processors, the instructions comprising instructions to perform the elements of the inventive concept as described herein.

Other similar or non-similar modifications can be made without deviating from the intended scope of the inventive concept. Accordingly, the inventive concept is not limited except as by the appended claims.

What is claimed is:

1. A method for mask triggering on a test and measurement instrument, the method comprising:
   receiving and digitizing an electrical signal under test such that digital data is produced;
   determining, in real-time, that first components of the digital data bear a first predefined relationship to a first trigger mask;
   determining that second components of the digital data bear a second predefined relationship to a second trigger mask within a predefined period of time after the first components are determined to bear the predefined relationship with the first trigger mask;
   generating a trigger signal in response to determining that the second components bear the second predefined relationship to the second trigger mask within the predefined period of time; and
   storing the digital data in a memory in response to the trigger signal.

2. The method of claim 1, further comprising:
   displaying a representation of the digital data as a trace in the frequency domain, time domain or both.

3. The method of claim 1, wherein:
   determining that the first components bear the first predefined relationship with the first trigger mask is based on whether the first components bear the first predefined relationship with the first trigger mask for a period of time that is longer than or equal to a predefined time threshold.

4. The method of claim 1, wherein:
   determining that the first components bear the first predefined relationship with the first trigger mask is based on whether the first components dwell within the first trigger mask for a period of time that is longer than or equal to a predefined time threshold.

5. The method of claim 1, wherein:
   determining that the first components bear the first predefined relationship with the first trigger mask is based on whether the first components bear the first predefined relationship with the first trigger mask for a period of time that is shorter than or equal to a predefined time threshold.

6. The method of claim 1, wherein:
   determining that the first components bear the first predefined relationship with the first trigger mask is based on whether the first components dwell within the first trigger mask for a period of time that is shorter than or equal to a predefined time threshold.

7. The method of claim 1, wherein:
   determining that the second components bear the second predefined relationship with the second trigger mask is based on whether the second components dwell within the second trigger mask within the predefined period of time.

8. A method for triggering on a test and measurement instrument, the method comprising:
   receiving and digitizing an electrical signal under test such that digital data is produced;
   determining that a first set of components of the digital data violate a first of a plurality of trigger masks;
   arming trigger criteria associated with a second of the plurality of trigger masks in response to the determination;
   determining that second components of the digital data violate the second of the plurality of trigger masks in accordance with the trigger criteria;
   generating a trigger signal in response to determining that the second components violate the second of the plurality of trigger masks; and
   storing the digital data in a memory in response to the trigger signal.

9. The method of claim 8, wherein
   determining that the second components violate the second of the plurality of trigger masks in accordance with the trigger criteria is based on a density of the second components meeting or exceeding a predefined density threshold within a predefined time period after arming the trigger criteria.

10. A test and measurement instrument, comprising:
    an input configured to receive and digitize an electrical signal under test to produce digital data;
    a memory coupled to the input;
    mask trigger logic, coupled to the input and the memory, configured to;
       determine that first components of the digital data bear a first predefined relationship to a first trigger mask;
       determine that second components of the digital data bear a second predefined relationship to a second trigger mask within a predefined period of time after the first components are determined to bear the predefined relationship with the first trigger mask;
       generate a trigger signal in response to determining that the second components bear the second predefined relationship to the second trigger mask within the predefined period of time; and
       store the digital data in the memory in response to the trigger signal.

11. The test and measurement instrument of claim 10, further comprising a display device configured to display a representation of the digital data
    in the frequency domain or time domain.

12. The test and measurement instrument of claim 10, wherein
    to determine that the first components bear the first predefined relationship with the first trigger mask is based on whether the first components bear the first predefined relationship for a period of time that is longer than or equal to a predefined time threshold.

13. The test and measurement instrument of claim 12, wherein
    to determine that the first components bear the first predefined relationship with the first trigger mask is further based on whether the first components dwell within the trigger mask for the period of time.

14. The test and measurement instrument of claim 10, wherein
  to determine that the first components bear the first predefined relationship with the first trigger mask is based on whether the first components bear the first predefined relationship for a period of time that is shorter than or equal to a predefined time threshold.

15. The test and measurement instrument of claim 14, wherein
  to determine that the first components bear the first predefined relationship with the first trigger mask is further based on whether the first components dwell within the trigger mask for the period of time.

16. The test and measurement instrument of claim 10, wherein
  to determine that the second components bear the second predefined relationship within the predefined period of time is based on whether the second components dwell within the second trigger mask within the predefined period.

17. The test and measurement instrument of claim 10, wherein
  to determine that the first components bear the first predefined relationship with the first trigger mask is based on whether the first components are present within the first trigger mask; and
  to determine that the second components bear the second predefined relationship with the second trigger mask is based on whether the second components are absent from the second trigger mask.

18. A test and measurement instrument, comprising:
  an input configured to receive and digitize an electrical signal under test to produce digital data;
  a display device configured to display a representation of the digital data;
  a plurality of trigger masks being arranged on the display device;
  mask trigger logic configured to:
  determine that first components of the digital data violate a first of the plurality of trigger masks;
  arm trigger criteria associated with a second of the plurality of trigger masks in response to the determination;
  determine that second components of the digital data violate the second of the plurality of trigger masks in accordance with the trigger criteria; and
  generate a trigger signal in response to the determinations; and
  a memory coupled to the input and configured to store the digital data in response to the trigger signal.

19. The test and measurement instrument of claim 18, wherein to determine that the second components violate the second of the plurality of trigger masks in accordance with the trigger criteria is based on a density of the second components meeting or exceeding a predefined density threshold within a predefined time period after arming the trigger criteria.

* * * * *